United States Patent [19]

Kondo et al.

[11] Patent Number: 4,810,528

[45] Date of Patent: Mar. 7, 1989

[54] PROCESS FOR PRODUCING MULTILAYER CIRCUIT BOARD

[75] Inventors: Kazuo Kondo, Nagoya; Hisaharu Shiromizu, Inuyama; Asao Morikawa, Komaki; Tsuneyuki Sukegawa, Kasugai, all of Japan

[73] Assignee: NGK Spark Plug Co., Nagoya, Japan

[21] Appl. No.: 901,335

[22] Filed: Aug. 28, 1986

[30] Foreign Application Priority Data

Aug. 28, 1985 [JP] Japan ................................ 60-189196

[51] Int. Cl.$^4$ ............................................. B05D 5/12
[52] U.S. Cl. ......................................... 427/96; 427/97; 427/383.5
[58] Field of Search .................. 29/851, 852; 427/97, 427/383.5, 96

[56] References Cited

U.S. PATENT DOCUMENTS

| | | |
|---|---|---|
| 2,993,815 | 7/1961 | Treptow . |
| 3,914,517 | 10/1975 | Pirooz .................. 427/383.5 |
| 4,191,789 | 3/1980 | Brown ...................... 427/97 |
| 4,234,367 | 11/1980 | Herron ..................... 156/89 |
| 4,490,429 | 12/1984 | Tosaki ...................... 427/97 |
| 4,551,357 | 11/1985 | Takeuchi ................... 427/96 |
| 4,627,160 | 12/1986 | Herron ..................... 427/96 |
| 4,629,681 | 12/1986 | Takada ..................... 427/96 |
| 4,671,928 | 6/1987 | Herron ..................... 427/97 |
| 4,695,403 | 9/1987 | Nishimura ................. 252/518 |

OTHER PUBLICATIONS

P. L. Toch, J. Godrick and B. A. Shaw, Failure Mechanism and Process Control Requirements in the Production of Copper Multilayer Interconnect Boards, pp. 602-608, 1986.

*Primary Examiner*—Shrive Beck
*Assistant Examiner*—Vi D. Dang
*Attorney, Agent, or Firm*—Wegner & Bretschneider

[57] ABSTRACT

A process for producing a multilayer circuit board composed of crystallized glass and copper-metallized circuit patterns, which comprises:

(1) providing a green sheet of a crystallizable glass powder;

(2) providing a copper paste comprising copper component (copper and/or copper oxide) and a glass powder in a proportion by weight of the copper component to the glass powder 95:5 to 75:25, copper oxide being calculated on copper;

(3) printing a circuit pattern of the copper paste of step (2) on the green sheet of step (1);

(4) coating on the green sheet of step (3) an insulating paste to form an insulating layer except for regions assigned for through holes;

(5) printing on the insulating layer of step (4) a circuit pattern of the copper paste of step (2) and filling said holes with the copper paste make a conductive connection through said holes;

(6) decomposing the binders by heating the product of step (5) under an oxidizing atmosphere at 400°–850° C.; and (7) heating the product of step (6) at 850°–1050° C. under a reducing atmosphere for a period of time sufficient to reduce copper oxide, sinter the product of step (6) and crystallize said glasses.

After step (5), pairs of steps (4) and (5) are repeated to make multilayer circuit boards.

16 Claims, No Drawings

PROCESS FOR PRODUCING MULTILAYER CIRCUIT BOARD

BACKGROUND OF THE INVENTION

The present invention relates to a process for producing a multilayer (or multi-ply) circuit board which is suitable for a ceramic package, multilayer boards and the like to be employed in the GHz-region requiring an especially low dielectric constant.

The Japanese Patent Kokai Publication No. 55-138899 entitled "A Process for Producing Glass Ceramic Structure", discloses the following process for producing ceramic multilayer boards using crystallized glass as an insulating material and copper as an electric conductive material, which comprises:

preparing a green laminated body by laminating a plurality of sheets each obtained by printing a pattern by using a paste containing copper as an electric conductive layer on a green sheet composed of glass particles which crystallize at a lower temperature than the melting point of copper, and injecting the copper paste into through-holes perforated beforehand at required positions of each of the green sheets;

heating the resulting laminated body at a temperature between a gradual cooling temperature and a softening temperature of the glass under a wet hydrogen atmosphere, which is oxidizing for carbon and non-oxidizing for copper, to decompose organic binders contained in the laminated body of said green sheets;

replacing the hydrogen atmosphere by an inactive atmosphere; and then heating the laminated body to a crystallizing temperature of the glass.

SUMMARY OF THE INVENTION

The process for producing multilayer circuit boards (hereinafter referred to as "sheet lamination process") disclosed in the above Japanese Patent Publication Kokai No. 55-128899, however, has a difficulties in mass production, since severe process control and regulation are required for the wet hydrogen atmosphere containing aqueous vapor in the decomposition of the organic binder contained in the green laminated body, and a plurality of insulating layers are laminated by press bonding green sheets.

Besides, the sheet lamination process entails occurrence of bubble-inclusion upon lamination. Through holes are formed by pressing or punching each green sheet, which requires use of a considerable number of different punching dies for each sheet of the laminate, which has different positions and designs of the through holes. This makes the change of the circuit pattern quite inconvenient, since the dies would also have to be changed. Such circumstances become more serious as the number of multilayer laminated layers increases. Due to punching and lamination, the edges of the through holes become dull, etc.

Accordingly, it is a primary goal of the present invention to provide a novel process which can eliminate these drawbacks in the prior art.

It is a further feature of the present invention to provide a process for producing a multilayer circuit board, which does not require strict process control, provides easy lamination between two insulating layers, and hence facilitates mass production.

Still other objects will become apparent from the entire disclosure.

According to one aspect of the present invention, there is provided a process for producing a multilayer circuit board composed of crystallized glass and copper-metallized circuit patterns, which comprises the following steps:

(1) providing a green sheet composed of a crystallizable glass powder and an organic binder;

(2) providing a copper paste comprising inorganic substance and an organic binder, the inorganic substance comprising a glass powder and at least one copper component selected from the group consisting of copper and copper oxide, and a glass powder of equivalent quality to that of the crystallizable glass powder, in a proportion by weight of the copper component to the glass powder 95:5 to 75:25, copper oxide being calculated as copper;

(3) printing a circuit pattern of the copper paste of step (2) on the green sheet of step (1);

(4) coating on the green sheet printed with the circuit pattern of step (3) an insulating paste comprising a glass powder of equivalent quality to that of the green sheet to form an insulating layer except for regions assigned for through holes;

(5) printing on the insulating layer of step (4) a circuit pattern of the copper paste of step (2) and simultaneously filling said holes with the copper paste to make a conductive connection between said circuit pattern on the insulating layer and that on the green sheet;

(6) decomposing the binders by heating the product of step (5) under an oxidizing atmosphere; and (7) heating the product of step (6) at a temperature of 850°–1050° C. under a reducing atmosphere for a period of time sufficient to reduce a substantial amount of copper oxide, sinter the product of step (6) and crystallize said glasses.

In step (6), the heating temperature is preferably 400°–850° C., and more preferably 650°–800° C. The preferred atmosphere at step (7) is decomposed is ammonia gas ($2NH_3 \rightarrow N_2 + 3H_2$) or hydrogen. For producing multilayer circuit boards having more than two circuit pattern layers, the following measures can be easily taken:

For providing an additional circuit pattern, after step (5), step (4) and step (5) are repeated provided that, in repeated step (4), the coating is applied on the insulating layer of step (4) instead of on the green sheet. For further multiplying the circuit patterns, after the pair of steps (4) and (5) defined above, at least one of said pair of steps is repeated.

Note that, after step (5) (or the repeated step (5) last in order) a further insulating layer (protective layer) may be optionally applied on the layer formed by step (5).

Printing of the insulating layers is made, preferably, by screen printing, whereupon through holes can be made without difficulty by masking the respective regions assigned for holes, thus eliminating the particular steps of hole forming shown in the prior art. Circuit patterns can be screen printed so that the through holes can be filled with the copper paste simultaneously with printing of the circuit pattern.

The present invention has the features of producing a circuit pattern made of a reduced metal copper on the crystallized glass layer or interposed therebetween, by heating the laminated body under an oxidizing atmosphere for decomposing and dissipating the organic binder contained therein, and then by heating the laminated body under a reducing atmosphere of the subsequent step to sinter crystallizable glass powders to form crystallized glass layers which serve as insulating layers for the circuit patterns of the copper paste (now metallized) comprising said crystallizable (now crystallized) glass. Therefore, the process according to the present invention has the significant effects of minimizing the production steps and lowering the production cost of IC-packages and multilayer circuit boards for use in the GHz-region, utilizing the excellent low dielectric constant which is characteristics of crystallized glass.

The circuit pattern design can be changed without difficulty by changing the masking pattern of the screens. Thus the present invention is suitable for mass production as well as for production of small quantities of many designs.

DESCRIPTION OF THE PREFERED EMBODIMENTS

In the present invention the copper paste contains the copper compound (copper and/or copper oxide) and the crystallizable glass in a particular proportion, which therefore improves the wettability between the insulating layer of glass and the electrically conductive layer. The heating is carried out in two steps under an oxidizing then reducing atmosphere, so it is easy to control the atmosphere. The plurality of insulating layers can be bonded by screen printing of the insulating paste (not by laminating green sheets), therefore a punching die and a punching step for each insulating sheet are not needed. Further, in the green sheet lamination process there may arise delamination, blistering or bubble inclusion between the sheets. Contrary thereto, such problems have been eliminated in the present invention.

The crystallizable glass powder may be selected from those which are sinterable and crystallizable between 850° and 1050° C., and have a dielectric constant of 7 or less and a coefficient of thermal expansion of $5.0 \times 10^{-6}$/°C. or less (for room temperture to 400° C.).

Typically, the preferred crystallizable glass powders are those disclosed in the Japanese Patent Publications (Kokai) Nos. 59-83957, 59-92943 and 59-137341. These glass powders have the merit in that remaining glassy phase is very little after crystallization according to the present process, and they are capable of supplying highly precise dimensions to the products, e.g., providing sharp edges to the through holes.

Copper oxide may be $Cu_2O$, $CuO$ etc, preferably $CuO$. The copper oxide forms an intermediate layer between a metallized Cu layer and a crystallized glass layer, serving to improve the wettability and thus good adhesion between the laminated layers.

Preferably, the powders (glass and copper/copper oxide) have a mean grain size of 2 μm or less, more preferably 1.5 μm or less. The organic binder may be a known one usually used with a solvent in order to ajust the viscosity of the paste. Ethylcellulose and butylcarbitol are preferred as the binder and solvent, respectively.

It is required that the firing temperature under an oxidizing atmosphere of the preceding step should be in the range of 400°-850° C. In a temperature of less than 400° C., an organic binder may remain as an impurity in the laminated material due to insufficient carbonization, oxidation and volatilization. At a temperature of more than 850° C. warping of laminated materials may occur in the subsequent heating under a reducing atmosphere.

A preferred range is 650°-800° C. It is required that the heating temperature under the reducing atmosphere of the subsequent step should be in a range of 850°-1050° C. At a temperature less than 850° C., there are obtained neither sufficient electric conductivity of the copper circuit pattern, nor good insulating property of the crystallized glass, while at a temperature of more than 1050° C., a complete circuit pattern is not achieved through melting of the copper layer in the circuit pattern. A preferred range is 880°-950° C.

The range of 95-75 % by weight (in terms of copper) of copper and/or copper oxide as the inorganic substance in a starting material for forming the circuit pattern, based on the weight of the sum of said "copper and/or copper oxide" and crystallized glass powder, provides the required electric conductivity and a sufficient wettability with the two neighboring crystallized glass layers. Amounts outside this range cause a difficulty in practical use, since above 95% by weight, the strength is insufficient because of too small amount of crystallized glass powder, and below 75% by weight, the electric resistance is too great. The range of $(90 \pm 2)$%–$(10 \pm 2)$% by weight (in terms of copper) of "copper and/or copper oxide" to glass as starting material is preferred, since significantly excellent wettability is obtained.

Though at the first heating step in the oxidizing atmosphere the copper component (copper/copper oxide) in the copper paste is oxidized to form copper oxide, it is then by the second heatig in the reducing atmosphere reduced to copper in a substantial amount to provide a metallized copper circuit layer which is electronically conductive.

The present invention will be described in more detail with reference to the following examples; however these examples are not to be construed to limit the scope of the present invention.

EXAMPLE

Step 1

In the same manner as in specimen No. 5 of Example disclosed in the Japanese Patent Publication (Kokai) No. 59-92943 "crystallized glass material" filed by the same applicant ZnO, $MgCO_3$, $Al(OH)_3$, $SiO_2$, $H_3BO_3$ and $H_3PO_4$ were weighed so as to provide a composition of 4 % ZnO, 13% MgO, 33% $Al_2O_3$, 58% $SiO_2$, 1% $B_2O_3$ and 1% $P_2O_5$ (by weight), were mixed by using a machine mortar, were melted in an alumina crucible at 1450° C. to be vitrified, and then the resultant glass was charged into water to be quenched. The glass particles or blocks thus obtained were pulverized to an average grain size of 2 μm by means of an alumina made-bail mill to produce a frit.

Step 2

An organic binder (polyvinyl butyral, about in 10-20 wt parts) and a suitable amount of a solvent (methylethylketone and toluene, in total about 50 wt parts) were added to the obtained frit to prepare a slurry, and a green substrate sheet of 0.6 mm thickness was produced from this slurry by using the doctor blade method.

Step 3

An organic binder (ethylcellulose, about in 10-20 wt parts) and a solvent (butylcarbitol, about 30 wt parts) were added to the frit obtained in step 1 to produce a glass paste.

Step 4

An organic binder (as above, 5 wt parts relative to 100 wt parts of the inorganic admixture) and a solvent (same as above) were added to an inorganic admixture of 95–75% by weight (in terms of copper) of CuO having an average grain size of 1.5 μm and 5–25% by weight of the frit obtained in step 1 to prepare a copper paste.

Step 5

The copper paste obtained in step 4 was screen-printed on the surface of the green substrate sheet obtained in step 2 so as to produce a pattern as a conductive layer constituting 40 stripes at an interval of 1 mm, each stripe being 20 μm thick, 40 mm long and 0.5 μm wide.

Step 6

The glass plate obtained in step 3 was coated in 40 μm thickness, providing 200 small holes of a 300 μm diameter in portions positioned on the copper paste-stripes as a conductive layer (of a substrate sheet), on the screen-printed surface of said green sheet by a screen-printed method using a screen having masked portions corresponding to the small (through) holes.

Step 7

On the glass-plate layer obtained in step 6, the same stripes, each of which was at a right angle to each of many stripes composed of the copper paste of step 5 and each of which extends over each of said 200 small holes, were screen-printed by using a copper paste, whereupon simultaneously the copper paste was injected into said small holes to partially connect each one of the copper paste-stripes of an upper layer and each one of those of a lower layer isolated by the glass paste layer, respectively.

Step 8

Further, at least one pair of layers consisting of the glass paste layer obtained in step 6 and the copper paste layer obtained in step 7 were further laminated on the above obtained laminated body (i.e., the pair of steps 6 and 7 was repeated. In the laminated body of the previous step, a copper paste had been charged into the small holes formed beforehand in each previous step 7 in a stripe-like pattern extending across the small holes). 3 pairs of such layers were laminated in this example.

Step 9

The resultant laminated body was cut in a size of 50×50 mm.

Step 10

The temperature of the cut laminated bodies was raised to 700° C. in 5 hours (at a heating rate of 2° C./min) in an electric furnace in air.

Step 11

The laminated bodies heated at step 11 were removed into a hydrogen-atmosphere furnace, and then the temperature thereof was raised to 950° C. in 5 hours (kept above 850° C. for 2.5 hours).

In the above steps, there were obtained multilayer circuit boards made of crystallized glass having 5 copper metallized layers, said copper metallized layers being electrically connected with each other only at required positions, and each of said copper metallized layers being composed of many stripes crossing at right angles with the stripes of neighboring layers separated by an insulating glass layer.

The crystallized glass of the obtained multilayer circuit board, which was completely sintered, provided a water absorbency of zero, a specific dielectric constant of not exceeding 6.2 measured at 10.3 GHz. The copper-metallized layer thereof provides a bonding strength of 2 kg (when measured by applying a metallization of 20 mm square area and a 20 μm thickness), and an electrical resistance of $5.09 \times 10^{-6}$ Ωcm (when measured in 1 mm width, 50 mm length and 20 μm thickness).

Although the specimen No. 5 disclosed in Japanese Patent Publication (Kokai) No. 50-92943, "Crystllized glass material", was used in this Example, the glass composition of a specimen can be selected pursuant to the purpose.

It should be noted that modification may be made without departing from the gist of the present invention as herein disclosed and claimed hereinbelow.

What is claimed is:

1. A process for producing a multilayer circuit board composed of crystallized glass and copper-metallized circuit patterns, which comprises the following steps:
    (1) providing a green sheet consisting essentially of a crystallizable glass powder and an organic binder;
    (2) providing a copper paste comprising an inorganic substance and an organic binder, the inorganic substance comprising a glass powder and at least one copper component selected from the group consisting of copper and copper oxide, and a glass powder having an equivalent quality to that of the crystallizable glass powder, in a proportion by weight of the copper component to the glass powder 95:5 to 75:25, copper oxide, calculated as copper;
    (3) printing a circuit pattern of the copper paste of step (2) on the green sheet of step (1) including predetermined regions for through holes;
    (4) coating on the green sheet printed with the circuit pattern of step (3) an insulating paste comprising a glass powder of equivalent quality to that of the green sheet to form an insulating layer except for the regions assigned for through holes;
    (5) printing on the insulating layer of step (4) a circuit pattern of the copper paste of step (2) and simultaneously filling said through holes with the copper paste to make a conductive connection between said circuit pattern on the insulating layer and that on the green sheet;
    (6) decomposing the binders by heating the product of step (5) under an oxidizing atmosphere; and
    (7) heating the product of step (6) at a temperature of 850°–1050° C. under a reducing atmosphere for a period of time sufficient to reduce a substantial amount of copper oxide, sinter the product of step (6) and crystallize said glasses.

2. The process as defined in claim 1, wherein step (6) is carried out at a temperature of 400°–850° C.

3. The process as defined in claim 1, wherein step (4) is carried out by screen printing with a screen having masked regions assigned for the through holes.

4. The process as defined in claim 1, wherein, in step (5), the filling said holes is carried out by screen printing with a screen having said circuit pattern which includes the regions assigned for the through holes.

5. The process as defined in claim 1, wherein the proportion by weight of the copper component to the glass powder is 92:8 to 88:12.

6. The process as defined in claim 1, wherein after step (5), a pair of step (4) and step (5) is repeated provided that, in repeatedstep (4), coating is made on the insulating layer of step (4) instead of the green sheet.

7. The process as defined in claim 6, wherein after the pair of steps defined in claim 6, at least one of said pair of steps is repeated.

8. The process as defined in claim 1, wherein after step (5) a further insulating layer is applied on the layer formed by step (5).

9. The process as defined in claim 6, wherein after the repeated step (5) a further insulating layer is applied on the layer formed by the repeated step (5).

10. The process as defined in claim 7, wherein after the finally repeated step (5) a further insulating layer is applied on the layer formed by the finally repeated step (5).

11. The process as defined in claim 1, wherein step (7) is carried out at a temperature of 880°–950° C.

12. The process as defined in claim 1, wherein step (7) is carried out for a period of time sufficient to reduce copper oxide to form a conductive circuit pattern while remaining an intermediate layer of copper oxide at the boundary with the neighboring glass layer.

13. The process as defined in claim 1, wherein in step (7), said reducing atmosphere is an ammonium decomposed gas or hydrogen.

14. The process as defined in claim 1, wherein in step (6), said oxidizing atmosphere is air.

15. The process as defined in claim 1, wherein in step (2), the copper component is copper oxide.

16. A process for producing a multilayer circuit board composed of crystallized glass and copper-metallized circuit patterns, which comprises the following steps:
   (1) providing a green sheet consisting essentially of a crystallizable glass powder and an organic binder;
   (2) providing a copper paste comprising an inorganic substance and an organic binder, the inorganic substance comprising a glass powder and at least one copper component selected from the group consisting of copper and copper oxide, the glass powder of equivalent quality to that of the crystallizable glass powder, in a proportion by weight of the copper component to the glass powder 95:5 to 75:25, copper oxide, calculated as copper;
   (3) printing a circuit pattern of the copper paste of step (2) on the green sheet of step (1) including predetermined regions for through holes;
   (4) coating on the green sheet printed with the circuit pattern of step (3) an insulating paste comprising a glass powder of equivalent quality to that of the green sheet to form an insulating layer except for the regions assigned for the through holes;
   (5) printing on the insulating layer of step (4) a circuit pattern of the copper paste of step (2) and simultaneously filling the through holes with the copper paste to make a conductive connection between said circuit pattern on the insulating layer and that on the green sheet;
   (6) heating the product of step (5) at a temperature of 650°–800° C. under an oxidizing atmosphere for a period of time sufficient to decompose the binders; and
   (7) heating the product of step (6) at a temperature of 850°–1050° C. under a reducing atmosphere for a period of time sufficient to reduce a substantial amount of copper oxide, sinter the product of step (6) and crystallize said glasses.

* * * * *